United States Patent [19]
Isono et al.

[11] Patent Number: 5,811,845
[45] Date of Patent: *Sep. 22, 1998

[54] SEMICONDUCTOR APPARATUS AND HORIZONTAL REGISTER FOR SOLID-STATE IMAGE PICKUP APPARATUS WITH PROTECTION CIRCUIT FOR BYPASSING AN EXCESS SIGNAL

[75] Inventors: Hideto Isono; Hiroshi Hibi, both of Kanagawa, Japan

[73] Assignee: Sony Corporation, Japan

[*] Notice: The term of this patent shall not extend beyond the expiration date of Pat. No. 5,371,392.

[21] Appl. No.: 697,168

[22] Filed: Aug. 20, 1996

Related U.S. Application Data

[63] Continuation of Ser. No. 663,609, Jun. 14, 1996, Pat. No. 5,641,981, which is a continuation of Ser. No. 290,081, Aug. 12, 1994, abandoned, which is a division of Ser. No. 80,121, Jun. 23, 1993, Pat. No. 5,371,392.

[30] Foreign Application Priority Data

Jun. 29, 1992 [JP] Japan ................... 4-196174

[51] Int. Cl.$^6$ .................. H01L 29/78; H01L 27/02; H01L 29/72

[52] U.S. Cl. .................. 257/256; 257/215; 257/362; 257/363

[58] Field of Search .................. 257/355, 356, 257/357, 358, 360, 361, 362, 363, 236, 215

[56] References Cited

U.S. PATENT DOCUMENTS

5,371,392  12/1994  Isono et al. .................. 257/236

FOREIGN PATENT DOCUMENTS

52-3389  1/1977  Japan .................. 257/356

*Primary Examiner*—Ngân V. Ngô
*Attorney, Agent, or Firm*—Ronald P. Kananen

[57] ABSTRACT

A semiconductor apparatus connected between a signal input line and a grounding line is formed on a semiconductor substrate with a protection circuit connected between the signal input line and the grounding line, in parallel with the semiconductor apparatus. The protection circuit is formed, for example, of bipolar transistors, diodes, or MOS transistors.

9 Claims, 7 Drawing Sheets

F I G. 2
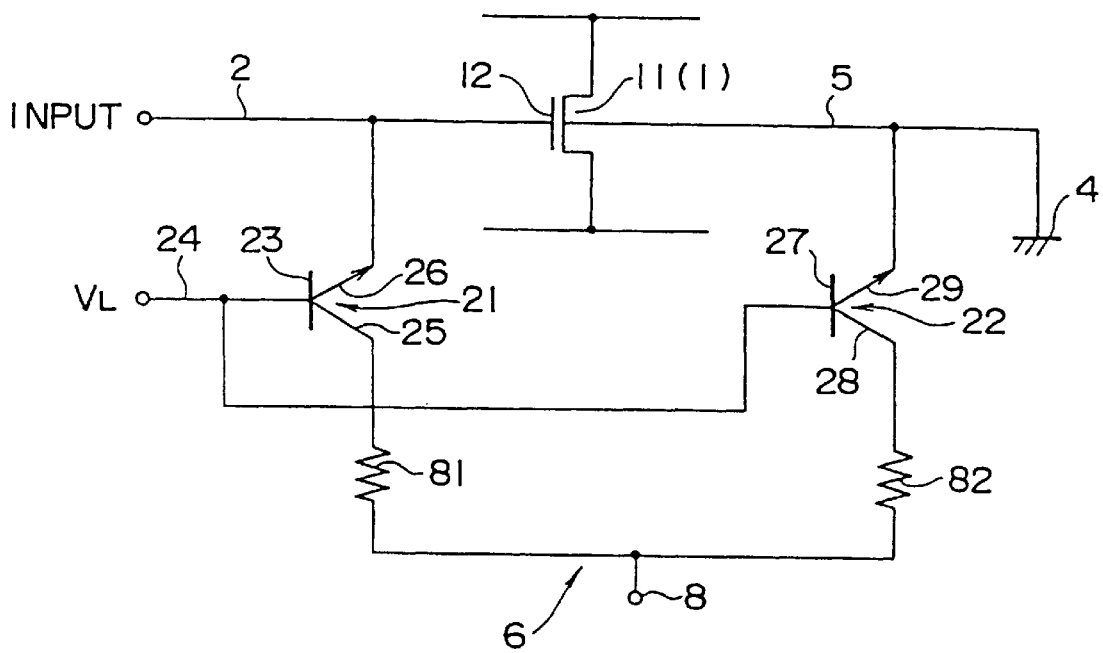
F I G. 3
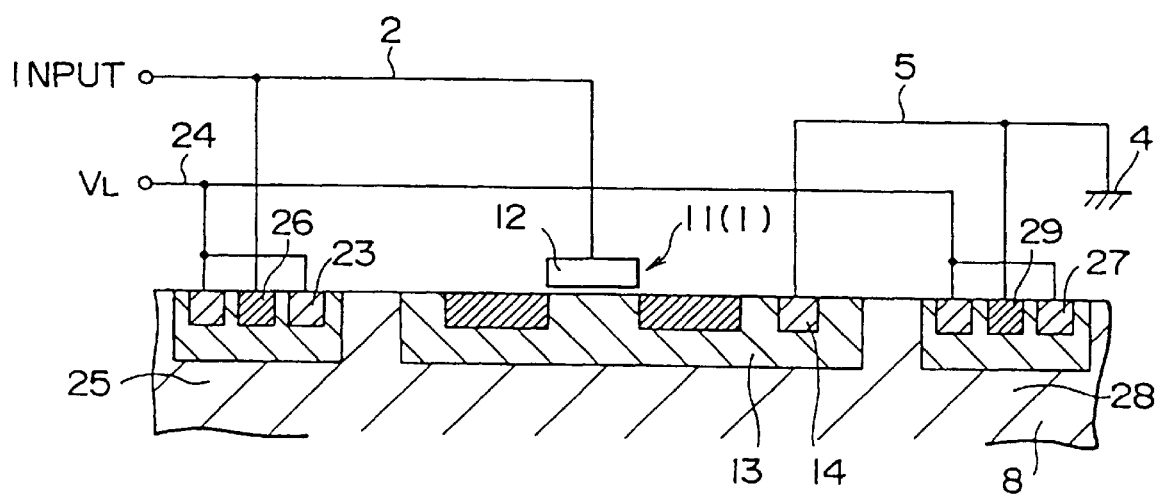

F I G. 8
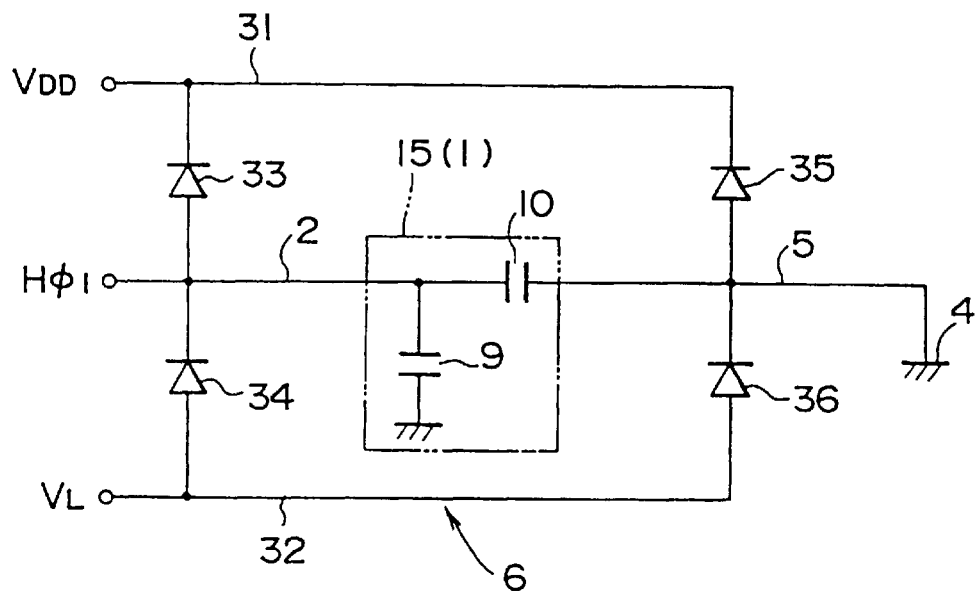
F I G. 9
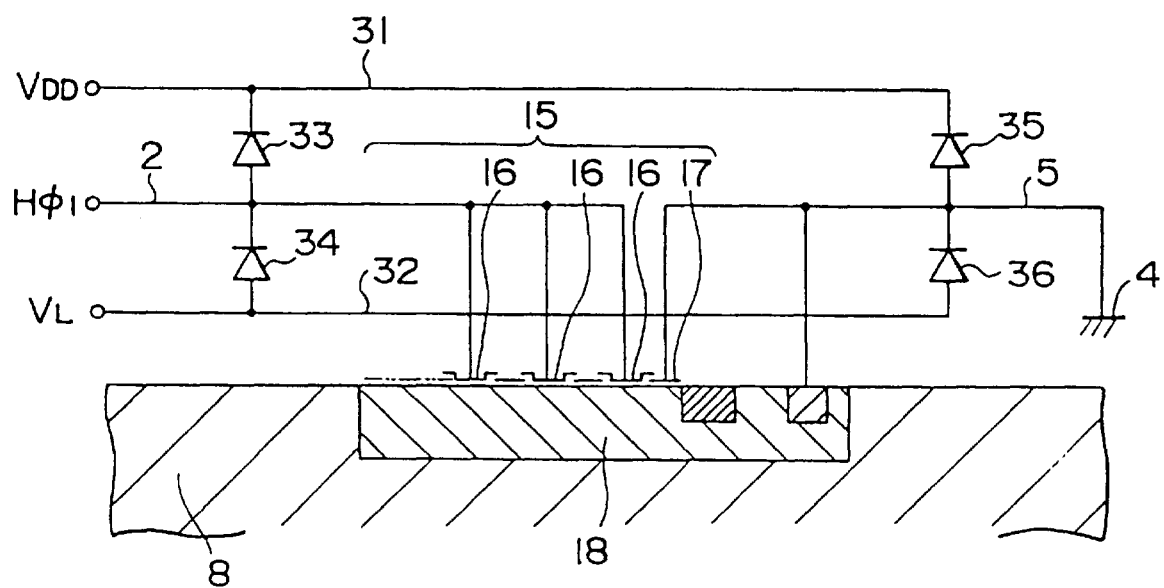

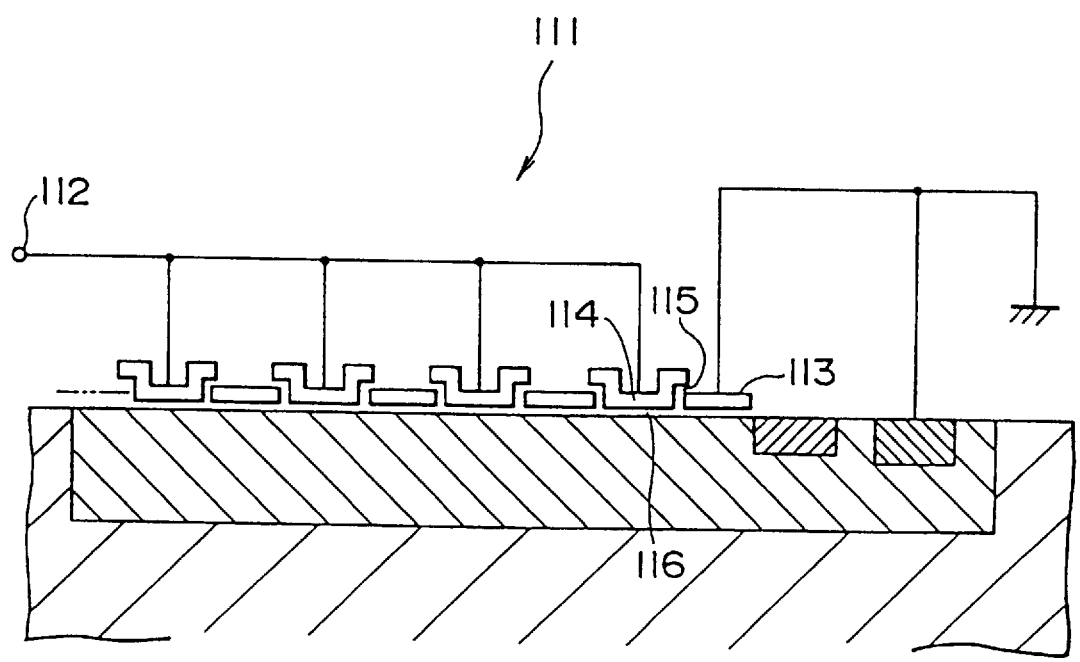
F I G. 12

SEMICONDUCTOR APPARATUS AND HORIZONTAL REGISTER FOR SOLID-STATE IMAGE PICKUP APPARATUS WITH PROTECTION CIRCUIT FOR BYPASSING AN EXCESS SIGNAL

This application is a continuation of application Ser. No. 08/663,609 filed Jun. 14, 1996, now U.S. Pat. No. 5,641,981 which is a continuation of Ser. No. 08/290,081 filed on Aug. 12, 1994, now abandoned which is a divisional of Ser. No. 08/080,121 filed on Jun. 23, 1993 and patented on Dec. 6, 1994, U.S. Pat. No. 5,371,392.

BACKGROUND OF THE INVENTION

1. Field of the Invention

The present invention relates to a semiconductor apparatus and an output transistor of a horizontal register for a solid-state image pickup apparatus provided with a protection circuit connected thereto.

2. Description of the Related Art

A MOS transistor incorporated in a circuit is sometimes used with the gate of the MOS transistor directly connected to a grounding terminal. For example, the gate of the output transistor of the horizontal register for a solid-state image pickup apparatus is usually connected to the grounding terminal.

In the output transistor of the described arrangement, it is possible that the gate insulating film of the output transistor is broken when an electrostatic impulse is impressed on the grounding terminal.

For example, when an electrostatic impulse is impressed on the input terminal 112 of the horizontal register 111 shown in FIG. 12, the insulating film 115 between the output gate 113 and the gate 114 or the insulating film 116 over the gate 114, etc., is liable to break down.

SUMMARY OF THE INVENTION

An object of the present invention is to provide a semiconductor apparatus and an output transistor of a horizontal register for a solid-state image pickup apparatus with a protection circuit connected thereto so as to be quite capable of withstanding an electrostatic impulse impressed on the grounding terminal.

The present invention was made to achieve the above mentioned object.

Accordingly, there is provided a semiconductor apparatus comprising a semiconductor element connected between a signal input line and a grounding line and a protection circuit connected between the signal input line and the grounding line, in parallel with the semiconductor element.

The above semiconductor element is formed, for example, of a MOS transistor and the protection circuit is formed of a negative potential line. A first bipolar transistor has its base connected to the negative potential line and the emitter connected to the signal input line and a second bipolar transistor has its base connected to the negative potential line, the collector connected to the collector of the first bipolar transistor, and the emitter connected to the grounding line.

In another manner, while the semiconductor element is formed, for example, of a MOS transistor, the protection circuit is formed of a power supply line, a negative potential line, a first diode connected between the signal input line and the power supply line such that a forward current flows therethrough from the signal input line to the power supply line, a second diode connected between the negative potential line and the signal input line such that a forward current flows therethrough from the negative potential line to the signal input line, a third diode connected between the grounding line and the power supply line so that a forward current flows therethrough from the grounding line to the power supply line, and a fourth diode connected between the negative potential line and the grounding line so that a forward current flows therethrough from the negative potential line to the grounding line.

In another manner, while the semiconductor element is formed, for example, of a MOS transistor, the protection circuit is formed of a negative potential line, a first MOS transistor of which the drain/source regions are connected to the signal input line and the negative potential line and the first well region where the channel is formed is connected to the negative potential line, a first capacitor connected between the gate of the first MOS transistor and the signal input line, a first resistor connected between the gate of the first MOS transistor and the negative potential line, a second MOS transistor of which the drain/source regions are connected to the grounding line and the negative potential line and the second well region where the channel is formed is connected to the negative potential line, a second capacitor connected between the gate of the second MOS transistor and the grounding line, and a first resistor connected between the gate of the second MOS transistor and the negative potential line.

There is also provided a horizontal register of a solid-state image pickup apparatus comprising a protection circuit connected between a signal input line, which is connected with the gate of the horizontal register, and a grounding line, which is connected with the output gate of the horizontal register, in parallel with the horizontal register.

In the above described horizontal register, the protection circuit is formed of at least a first bipolar transistor, of which the base is connected to a negative potential line and the emitter is connected to the signal input line of the horizontal register, and a second bipolar transistor, of which the base is connected to the negative potential line, the collector is connected to the collector of the first bipolar transistor, and the emitter is connected to the grounding line.

In the above described horizontal register, the protection circuit may be formed of a first diode connected between the signal input line and a power supply line such that a forward current flows therethrough from the signal input line to the power supply line, a second diode connected between the negative potential line and the signal input line such that a forward current flows therethrough from the negative potential line to the signal input line, a third diode connected between the grounding line, which is connected with the horizontal register of the solid-state image pickup apparatus, and the power supply line so that a forward current flows therethrough from the grounding line to the power supply line, and a fourth diode connected between the negative potential line and the grounding line so that a forward current flows therethrough from the negative potential line to the grounding line.

In the above described horizontal register, the protection circuit may be formed of a first MOS transistor of which the drain/source regions are connected to the signal input line and a negative potential line and the first well region where the channel is formed is connected to the negative potential line, a first capacitor connected between the gate of the first MOS transistor and the signal input line, a first resistor connected between the gate of the first MOS transistor and the negative potential line, a second MOS transistor of which the drain/source regions are connected to the grounding line and the negative potential line and the second well region where the channel is formed is connected to the negative potential line, a second capacitor connected between the gate of the second MOS transistor and the grounding line, and a first resistor connected between the gate of the second MOS transistor and the negative potential line.

In the semiconductor apparatus arranged as described above, a protection circuit is connected between the signal input line and the grounding line, in parallel with the semiconductor apparatus. Therefore, when an electrostatic impulse is impressed for example on the signal input line, an excessive current is passed through the protection circuit side so that the semiconductor apparatus is protected from an excessive current flowing therethrough. Thus the semiconductor apparatus is protected from breaking down.

Also in the horizontal register arranged as described above, a protection circuit is connected between the signal input line and the grounding line, in parallel with the horizontal register. Therefore, similarly to the above, an excessive current is passed through the protection circuit side so that the horizontal register is protected from an excessive current flowing therethrough. Thus the insulating film between gates, the insulating film over the gates, etc. can be protected from breaking down.

BRIEF DESCRIPTION OF THE DRAWINGS

FIG. 2 is a circuit diagram of a protection circuit of a MOS transistor;

FIG. 3 is a schematic structural diagram of a protection circuit of a MOS transistor;

FIG. 8 is a circuit diagram of a protection circuit of a horizontal register for a solid-state image pickup apparatus;

FIG. 9 is a schematic structural diagram of the horizontal register shown in FIG. 8;

FIG. 12 is a diagram explanatory of a problem to be solved.

DESCRIPTION OF THE PREFERRED EMBODIMENTS

An embodiment of the present invention will be described below with reference to a block diagram of FIG. 1.

Figure 1:
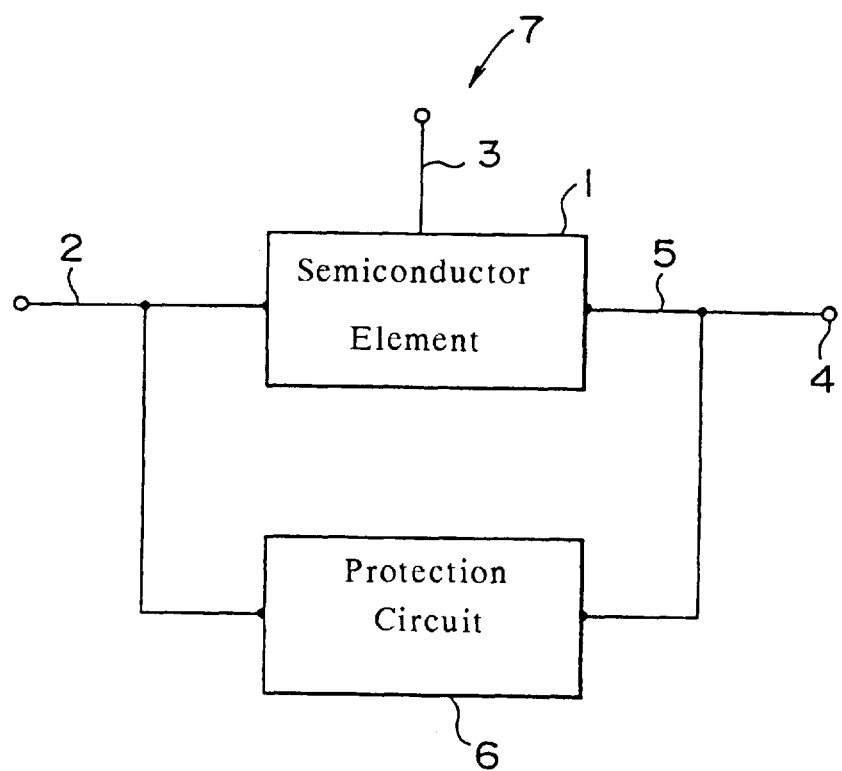
FIG. 1 is a block diagram showing an embodiment of the present invention.

As shown in FIG. 1, a semiconductor element 1 is connected with a signal input line 2 for inputting a signal thereto and a signal output line 3 for outputting a signal therefrom, and it is further connected to a grounding line 5, which is connected with a grounding terminal 4.

Between the signal input line 2 and the grounding line 5, there is inserted a protection circuit 6 connected in parallel with the semiconductor element 1.

A semiconductor apparatus 7 is composed of these elements as described above.

Since the semiconductor apparatus 7 with the described arrangement has its semiconductor element 1 provided with the protection circuit 6 connected in parallel therewith, when for example an electrostatic impulse is impressed on the signal input line 2 or the grounding line 5 with the potential of the grounding terminal 4 held at 0 V, an excessive current flows through the side of the protection circuit 6, and thereby the semiconductor element 1 can be protected from the electrostatic impulse.

A case, in the above block diagram, where the semiconductor element is a MOS transistor and the protection circuit is formed of bipolar transistors will be described below with reference to a circuit diagram of FIG. 2 and a schematic structural diagram in section of FIG. 3 showing an example of the above circuit.

As shown in the diagrams, the semiconductor element 1 is constituted of an ordinary MOS transistor 11. The gate 12 of the MOS transistor 11 is connected to the signal input line 2. The well region 13 where the channel of the MOS transistor 11 is formed is connected, through a take-off region 14, to the grounding line 5, which is connected with the grounding terminal 4.

Between the signal input line 2 and the grounding line 5, there is connected a protection circuit 6 in parallel with the MOS transistor 11.

The protection circuit 6 is formed of a first bipolar transistor 21 and a second bipolar transistor 22. The base 23 of the first bipolar transistor 21 is connected to a negative potential line 24 supplying a negative potential $V_L$. The collector 25 of the first bipolar transistor 21 is constituted of the semiconductor substrate 8. Further, the emitter 26 of the first bipolar transistor 21 is connected to the signal input line 2.

The base 27 of the second bipolar transistor 22 is connected to the negative potential line 24. The collector 28 of the second bipolar transistor 22 is constituted of the semiconductor substrate 8. Further, the emitter 29 of the second bipolar transistor 22 is connected to the grounding line 5. Resistors 81 and 82 shown in the circuit diagram represent the substrate resistance of the semiconductor substrate 8.

Since the protection circuit 6 is provided for the MOS transistor 11 of the described arrangement, when an electrostatic impulse of positive potential is impressed on the signal input line 2 of the MOS transistor 11 with its ground potential held, for example, at 0 V, a voltage exceeding the punchthrough voltage is applied to the first bipolar transistor 21. Accordingly, while the potential of the semiconductor substrate 8 rises, the potential of the negative potential line 24 also rises and, hence, the second bipolar transistor 22 is brought into its ON state. Consequently, a protection path, which allows current to flow through the signal input line 2, the emitter of the first bipolar transistor 21, the collector 25 of the same, the collector 28 of the second bipolar transistor 22, and the emitter 29 of the same in order of mention, is formed. Accordingly the MOS transistor 11 can be protected from the electrostatic impulse.

Further, when an electrostatic impulse of negative potential is impressed on the signal input line 2 of the MOS transistor 11 with the ground potential held, for example, at 0 V to lead to a voltage exceeding the punchthrough voltage of the first bipolar transistor 21 and the reverse-breakdown voltage between the emitter 26 and the base 23 of the same, a protection path is formed similarly to the above. Accordingly the MOS transistor 11 can be protected from the electrostatic impulse.

Now, a case, in the above block diagram, where the semiconductor element is a MOS transistor and the protection circuit is formed of diodes will be described below with reference to a circuit diagram of FIG. 4.

As shown in the diagram, the semiconductor element 1 is constituted of a MOS transistor 11. The gate 12 of the MOS transistor 11 is connected to the signal input line 2. The well region (not shown) where the channel of the MOS transistor 11 is formed is connected to the grounding line 5, which is connected with the grounding terminal 4.

Between the signal input line 2 and the grounding line 5, there is connected a protection circuit 6 in parallel with the MOS transistor 11.

The protection circuit 6 is provided with a power supply line 31 supplying a power supply potential and a negative potential line 32 supplying a negative potential.

Between the power supply line 31 and the signal input line 2, there is connected a first diode 33 such that a forward current flows therethrough from the signal input line 2 to the power supply line 31.

Between the negative potential line 32 and the signal input line 2, there is connected a second diode 34 such that a forward current flows therethrough from the negative potential line 32 to the signal input line 2.

Between the grounding line 5 and the power supply line 31, there is connected a third diode 35 such that a forward current flows therethrough from the grounding line 5 to the power supply line 31.

Further, between the negative potential line 32 and the grounding line 5, there is connected a fourth diode 36 such that a forward current flows therethrough from the negative potential line 32 to the grounding line 5.

Since the protection circuit 6, formed of the first to fourth diodes 33 to 36, is provided for the MOS transistor 11 of the described arrangement, when an electrostatic impulse of positive potential is impressed on the signal input line 2 of the MOS transistor 11 with its ground potential held for example at 0 V and thereby a voltage exceeding the reverse-breakdown voltage of the second diode 34 is applied thereto, the potential of the negative potential line 32 rises and hence the diode 36 is brought into its ON state. If, then, the power supply potential exceeds the reverse-breakdown voltage of the third diode 35 following the signal input, a protection path is produced. Accordingly the MOS transistor 11 can be protected from the electrostatic impulse.

Now, a case, in the above block diagram, where the semiconductor element is a MOS transistor and the protection circuit is formed of MOS transistors will be described below with reference to a circuit diagram of FIG. 5.

As shown in the diagram, the semiconductor element 1 is constituted of a MOS transistor 11. The gate 12 of the MOS transistor 11 is connected to the signal input line 2. The well region (not shown) where the channel of the MOS transistor 11 is formed is connected to the grounding line 5, which is connected with the grounding terminal 4.

Between the signal input line 2 and the grounding line 5, there is connected a protection circuit 6 in parallel with the MOS transistor 11.

The protection circuit 6 is provided with a negative potential line 41 supplying a negative potential.

Between the signal input line 2 and the negative potential line 41, there is connected a first MOS transistor 42. Namely, the signal input line 2 is connected to the source/drain region 43 on one side and the negative potential line 41 is connected to the source/drain region 44 on the other side.

Between the source/drain region 43 on the one side of the first MOS transistor 42 and the gate 45 of the first MOS transistor 42, there is connected a first capacitor 46. Between the source/drain region 44 on the other side of the first MOS transistor 42 and the gate 45, there is connected a first resistor 47. Further, the junction point 48 of the first resistor 47 and the source/drain region 44 on the other side is connected to a first well region (not shown), where the channel of the first MOS transistor 42 is formed.

Between the grounding line 5 and the negative potential line 41, there is connected a second MOS transistor 51. Namely, the grounding line 5 is connected to the source/drain region 52 on one side and the negative potential line 41 is connected to the source/drain region 53 on the other side.

Between the source/drain region 52 on the one side of the second MOS transistor 51 and the gate 54 of the second MOS transistor 51, there is connected a second capacitor 55. Between the source/drain region 53 on the other side of the second MOS transistor 51 and the gate 54, there is connected a second resistor 56. Further, the junction point 57 of the second resistor 56 and the source/drain region 53 on the other side is connected to a second well region (not shown), where the channel of the second MOS transistor 51 is formed.

Since the protection circuit 6 is provided for the MOS transistor 11 of the described arrangement, when an electrostatic impulse of positive potential is impressed on the signal input line 2 of the MOS transistor 11 with its ground potential held, for example, at 0 V, the gate voltage of the first MOS transistor 42 rises at the time constant determined by the first capacitor 46 and the first resistor 47. Accordingly, the potential of the negative potential line 41 rises. As a result, the potential in the area of diffused layer (not shown) forming the channel of the second MOS transistor 51 rises and, hence, the second MOS transistor 51 is brought into its ON state. Thus, a protection path from the first MOS transistor 42, through the negative potential line 41 and the second MOS transistor 51, to the grounding line 5 is formed. Accordingly the MOS transistor 11 can be protected from the electrostatic impulse.

Figure 6:
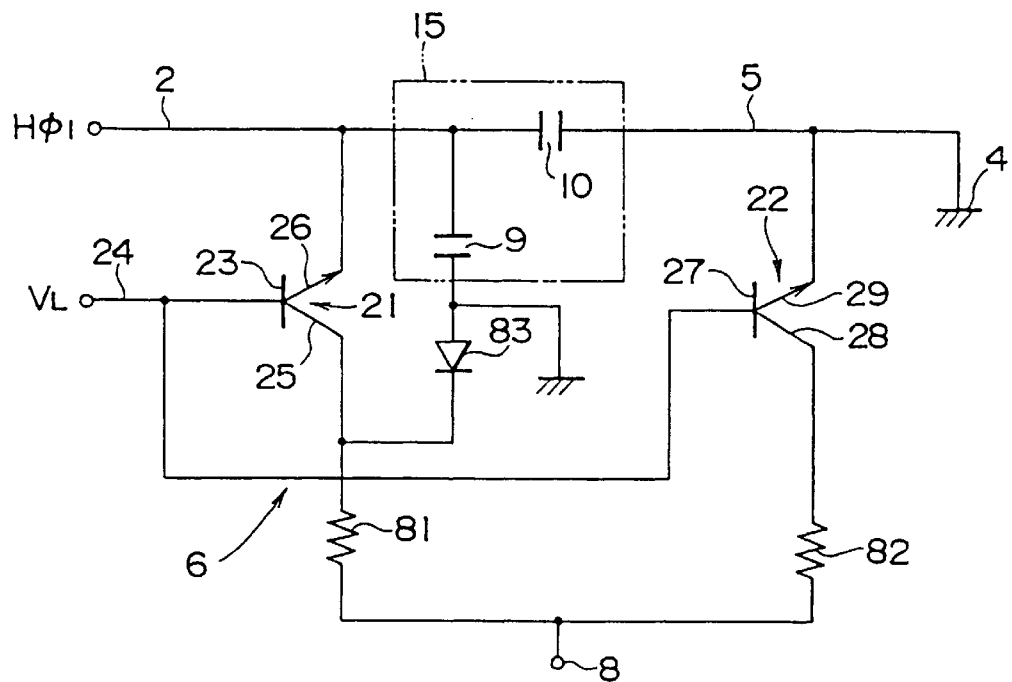
FIG. 6 is a circuit diagram of a protection circuit of a horizontal register for a solid-state image pickup apparatus.
Figure 7:
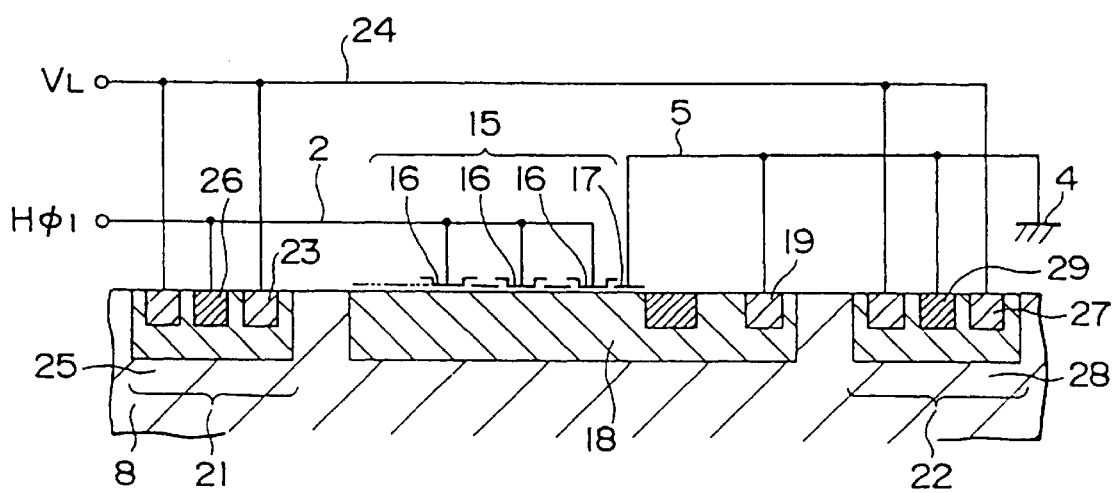
FIG. 7 is a schematic structural diagram of the horizontal register shown in FIG. 6.

Now, a case, in the above block diagram, where the semiconductor element is a horizontal register for a solid-state image pickup apparatus and the protection circuit is formed of bipolar transistors will be described below with reference to a circuit diagram of FIG. 6 and a schematic structural diagram in section of FIG. 7 showing an example of the circuit.

Component parts in FIG. 7 corresponding to those described above in FIG. 2 and FIG. 3 are denoted by like reference numerals.

As shown in the diagrams, the semiconductor element 1 is constituted of a horizontal register 15 (the portion enclosed by a two-dot chain line in the circuit diagram) of a solid state apparatus formed on the semiconductor substrate 8. The gates 16 of the horizontal register 15 are connected to the signal input line 2 to which a signal $H\phi_1$ is supplied. The output gate 17 of the horizontal register 15 is connected to the grounding line 5, which is connected with the grounding terminal 4. The capacitance between the gates 16 and the well region 18 in the schematic structural diagram is indicated by the capacitor 9 in the circuit diagram. Likewise, the capacitance between the gate 16 and the output gate 17 is indicated by the capacitor 10.

Between the signal input line 2 and the grounding line 5, there is connected a protection circuit 6 in parallel with the horizontal register 15.

The protection circuit 6 is provided with a negative potential line 24 supplying a negative potential. This negative potential line 24 is connected to the base 23 of a first bipolar transistor 21. The collector 25 of the first bipolar transistor 21 is constituted of the semiconductor substrate 8. Further, the signal input line 2 is connected to the emitter 26 of the first bipolar transistor 21.

The negative potential line 24 is connected to the base 27 of the second bipolar transistor 22. The collector 28 of the second bipolar transistor 22 is constituted of the semiconductor substrate 8. Further, the grounding line 5 is connected to the emitter 29 of the second bipolar transistor 22. The resistors 81 and 82 shown in the circuit diagram indicate the substrate resistance of the semiconductor substrate 8. Further, the diode 83 is constituted of the well region 18 and the semiconductor substrate 8.

Since the protection circuit 6 is provided for the horizontal register 15, when an electrostatic impulse of positive potential is impressed on the signal input line 2 with the ground potential held, for example, at 0 V, a voltage exceeding the punchthrough voltage is applied to the first bipolar transistor 21. Therefore, the potential of the semiconductor substrate 8 rises and the potential of the negative potential line 24 also rises, and hence the second bipolar transistor 22 is brought into its ON state. As a result, a protection path allowing current to flow from the signal input line 2, through the emitter 26 of the first bipolar transistor 21, the collector 25 of the same, and the collector 28 of the second bipolar transistor 22, to the emitter 29 of the same, is formed. Accordingly the horizontal register 15 of the solid-state image pickup apparatus can be protected from the electrostatic impulse.

A case, in the above block diagram, where the semiconductor element is a horizontal register of a solid-state image pickup apparatus and the protection circuit is formed of diodes will be described below with reference to a circuit diagram of FIG. 8 and a schematic structural diagram in section of FIG. 9 showing an example of the circuit.

Figure 4:
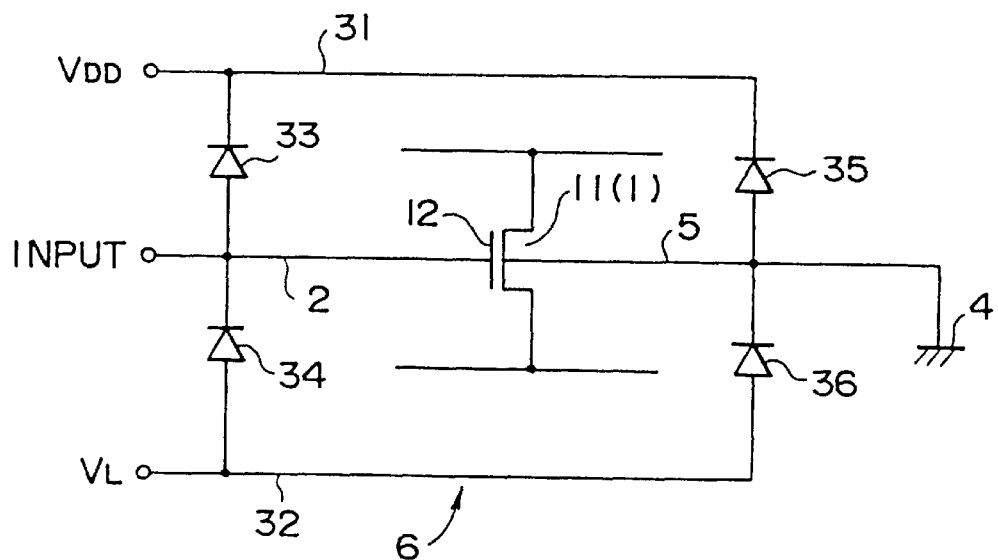
FIG. 4 is a circuit diagram of a protection circuit of a MOS transistor.

Component parts in FIGS. 8 and 9 corresponding to those described in FIG. 4 are denoted by like reference numerals.

As shown in the diagrams, the semiconductor element 1 is constituted of a horizontal register 15 (in the circuit diagram, the portion enclosed by a two-dot chain line) of a solid state image pickup apparatus formed on the semiconductor substrate 8. The gates 16 of the horizontal register 15 are connected with the signal input line 2 to which a signal $R\phi_1$ is supplied. The output gate 17 of the horizontal register 15 is connected with the grounding line 5, which is in connection with the grounding terminal 4. The capacitance between the gates 16 and the well region 18 in the schematic structural diagram is indicated by the capacitor 9 in the circuit diagram. Likewise, the capacitance between the gate 16 and the output gate 17 is indicated by the capacitor 10.

Between the signal input line 2 and the grounding line 5, there is connected a protection circuit 6 in parallel with the horizontal register 15.

The protection circuit 6 is provided with a power supply line 31 supplying a power supply potential $V_{DD}$ and a negative potential line 32 supplying a negative potential $V_L$.

Between the power supply line 31 and the signal input line 2, there is connected a first diode 33 such that a forward current flows therethrough from the signal input line 2 to the power supply line 31.

Between the negative potential line 32 and the signal input line 2, there is connected a second diode 34 such that a forward current flows therethrough from the negative potential line 32 to the signal input line 2.

Between the grounding line 5 and the power supply line 31, there is connected a third diode 35 such that a forward current flows therethrough from the grounding line 5 to the power supply line 31.

Further, between the negative potential line 32 and the grounding line 5, there is connected a fourth diode 36 such that a forward current flows therethrough from the negative potential line 32 to the grounding line 5.

Since the protection circuit 6 formed of the first to fourth diodes 33 to 36 is provided for the horizontal register 15 of the described arrangement, when an electrostatic impulse of positive potential is impressed on the signal input line 2 of the horizontal register 15 with its ground potential held, for example, at 0 V and, thereby, a voltage exceeding the reverse-breakdown voltage of the second diode 34 is applied thereto, the potential of the negative potential line 32 rises and hence the diode 36 is brought into its ON state. If, then, the power supply potential exceeds the reverse-breakdown voltage of the third diode 35 following the signal input, a protection path is produced. Accordingly the horizontal register 15 can be protected from the electrostatic impulse.

Figure 10:
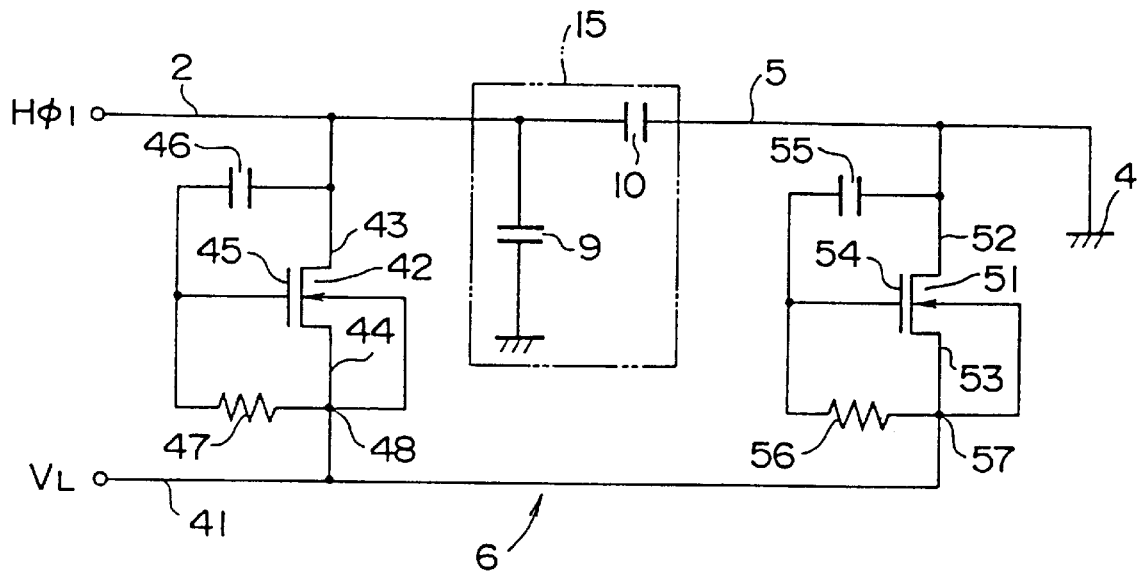
FIG. 10 is a circuit diagram of a protection circuit of a horizontal register for a solid-state image pickup apparatus.
Figure 11:
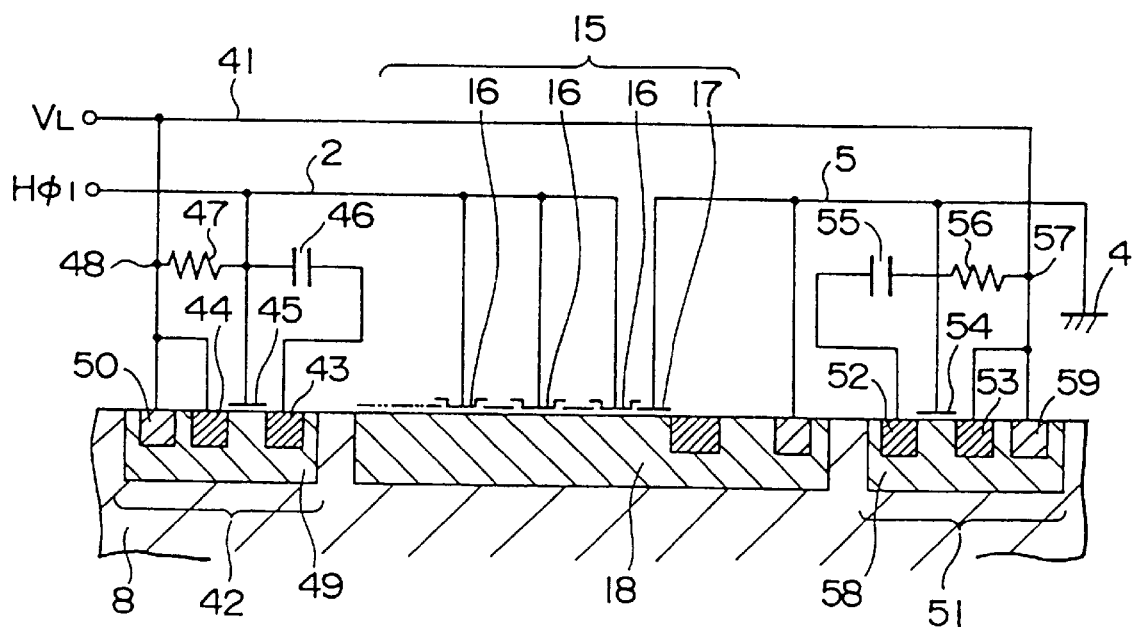
FIG. 11 is a schematic structural diagram of the horizontal register shown in FIG. 10.

Now, a case, in the above block diagram, where the semiconductor element is a horizontal register of a solid-state image pickup apparatus and the protection circuit is formed of MOS transistors will be described below with reference to a circuit diagram of FIG. 10 and a schematic structural diagram of FIG. 11 showing an example of the circuit.

Figure 5:
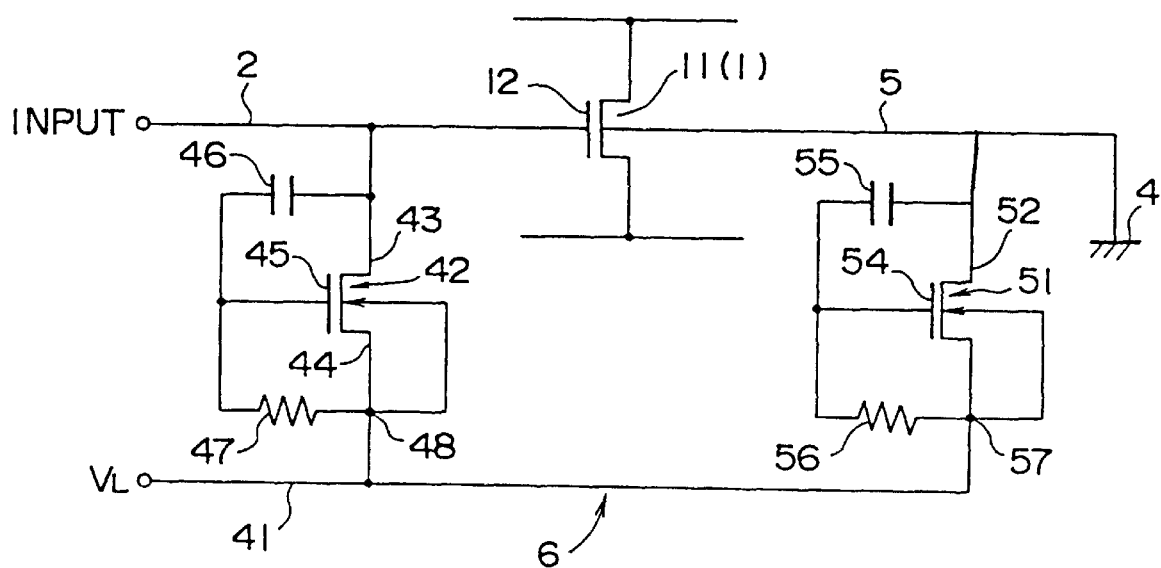
FIG. 5 is a circuit diagram of a protection circuit of a MOS transistor.

Component parts in FIGS. 10 and 11 corresponding to those described in FIG. 5 are denoted by like reference numerals.

As shown in the diagrams, the semiconductor element 1 is constituted of a solid state image pickup apparatus 15 (in the circuit diagram, the portion enclosed by a two-dot chain line) formed on the semiconductor substrate 8. The gates 16 of the horizontal register 15 are connected with the signal input line 2 to which a signal $H\phi_1$ is supplied. The output gate 17 of the horizontal register 15 is connected to the grounding line 5, which is in connection with the grounding terminal 4. The capacitance between the gates 16 and the well region 18 in the schematic structural diagram is indicated by the capacitor 9 in the circuit diagram. Likewise, the capacitance between the gate 16 and the output gate 17 is indicated by the capacitor 10.

Between the signal input line 2 and the grounding line 5, there is connected a protection circuit 6 in parallel with the horizontal register 15.

The protection circuit 6 is provided with a negative potential line 41 supplying a negative potential.

Between the signal input line 2 and the negative potential line 41, there is connected a first MOS transistor 42. Namely, the signal input line 2 is connected with the source/drain region 43 on one side and the negative potential line 41 is connected with the source/drain region 44 on the other side.

Between the source/drain region 43 on the one side of the first MOS transistor 42 and the gate 45 of the first MOS transistor 42, there is connected a first capacitor 46. Between the source/drain region 44 on the other side of the first MOS transistor 42 and the gate 45, there is connected a first resistor 47. Further, the junction point 48 of the first resistor 47 and the source/drain region 44 on the other side is connected to a first well region 49, where the channel of the first MOS transistor 42 is formed, through a take-off region 50.

Between the grounding line 5 and the negative potential line 41, there is connected a second MOS transistor 51.

Namely, the grounding line 5 is connected to the source/drain region 52 on one side and the negative potential line 41 is connected to the source/drain region 53 on the other side.

Between the source/drain region 52 on the one side of the second MOS transistor 51 and the gate 54 of the second MOS transistor 51, there is connected a second capacitor 55. Between the source/drain region 53 on the other side of the second MOS transistor 51 and the gate 54, there is connected a second resistor 56. Further, the junction point 57 of the second resistor 56 and the source/drain region 53 on the other side is connected to a second well region 58, where the channel of the second MOS transistor 51 is formed, through a take-off region 59.

Since the protection circuit 6 is provided for the horizontal register 15 of the described arrangement, when an electrostatic impulse of positive potential is impressed on the signal input line 2 of the horizontal register 15 with its ground potential held, for example, at 0 V, the gate voltage of the first MOS transistor 42 rises at the time constant determined by the first capacitor 46 and the first resistor 47. Accordingly, the potential of the negative potential line 41 rises. As a result, the potential in the second well region 58 of the second MOS transistor 51 rises and, hence, the second MOS transistor 51 is brought into its ON state. Thus, a protection path from the first MOS transistor 42, through the negative potential line 41 and the second MOS transistor 51, to the grounding line 5 is formed. Accordingly the MOS transistor 11 can be protected from the electrostatic impulse.

According to the present invention as described above, since there is provided a protection circuit connected between the signal input line and the grounding line, which are connected with such an apparatus as a semiconductor apparatus constituted of a MOS transistor or the like and a horizontal register of a solid-state image pickup apparatus, in parallel with the semiconductor apparatus constituted of a MOS transistor or the like or the horizontal register of a solid-state image pickup apparatus, it is made possible to protect the semiconductor apparatus constituted of a MOS transistor or the like or the horizontal register of a solid-state image pickup apparatus from an electrostatic impulse. Therefore, the reliability can be improved on such apparatus as the semiconductor apparatus constituted of a MOS transistor or the like or the horizontal register of a solid-state image pickup apparatus.

What is claimed is:

1. An electric circuit comprising:
    a circuit section having a first node connected to a signal input line inputting a voltage signal thereto and a second node connected to a reference voltage line; and
    a protection circuit connected between said signal input line and said reference voltage line, said protection circuit protecting said circuit section such that, when a voltage is applied to said input line which would damage said circuit section, an electric current flows between said signal input line and said reference voltage line through said protection circuit;
    wherein said circuit section comprises a charge coupled device having a plurality of closely spaced transfer gate electrodes, including a last transfer gate electrode, connected to said signal input line and an output gate electrode disposed next to said last transfer gate electrode and connected to said reference voltage line, said last transfer gate electrode constituting said first node of said circuit section and said output gate electrode constituting said second node of said circuit section.

2. An electric circuit comprising:
    a circuit section having a first node connected to a signal input line inputting a voltage signal thereto and a second node connected to a reference voltage line; and
    a protection circuit connected between said signal input line and said reference voltage line, said protection circuit protecting said circuit section such that, when a voltage is applied to said input line which would damage said circuit section, an electric current flows between said signal input line and said reference voltage line through said protection circuit;
    wherein said protection circuit comprises:
    a voltage line;
    a first bipolar transistor having a first base, a first emitter, and a first collector, said first base being connected to said voltage line and said first emitter being connected to said signal input line; and
    a second bipolar transistor having a second base, a second emitter, and a second collector, said second base being connected to said voltage line, said second collector being connected to said first collector, and said second emitter being connected to said reference voltage line.

3. A charge coupled device comprising:
    a semiconductor body;
    a channel region formed on said semiconductor body;
    an insulating film formed on said channel region;
    at least a transfer gate electrode formed over said channel region through said insulating film;
    an output gate electrode formed over said channel region through said insulating film, said output gate electrode being adjacent to and insulated from said transfer gate electrode;
    said output gate electrode electrically connected to a reference voltage line;
    said transfer gate electrode electrically connected to a signal input line inputting a voltage signal thereto;
    said transfer gate electrode and said output gate electrode constituting a circuit section; and a protection circuit connected between said signal input line and said reference voltage line, said protection circuit protecting said circuit section such that, when said circuit section receives a voltage which would damage said circuit section, an electric current flows between said signal input line and said reference voltage line through said protection circuit.

4. A charge coupled device according to claim 3, wherein said transfer gate electrode overlaps said output gate electrode.

5. A charge coupled device according to claim 3, wherein said output gate electrode overlaps said transfer gate electrode.

6. A charge coupled device according to claim 3, wherein said protection circuit comprises:
    a voltage line;
    a first bipolar transistor having a first base, a first emitter, and a first collector, said first base being connected to said voltage line and said first emitter being connected to said signal input line; and a second bipolar transistor having a second base, a second emitter, and a second collector, said second base being connected to said voltage line, said second collector being connected to said first collector, and said second emitter being connected to said reference voltage line.

7. A charge coupled device according to claim 3, wherein said protection circuit comprises:

a first voltage line;

a second voltage line whose voltage is higher than said reference voltage line;

a first diode having a first anode and a first cathode, said first anode being connected to said first voltage line and said first cathode being connected to said signal input line;

a second diode having a second anode and a second cathode, said second anode being connected to said signal input line and said second cathode being connected to said second voltage line;

a third diode having a third anode and a third cathode, said third anode being connected to said first voltage line and said third cathode being connected to said reference voltage line; and a fourth diode having a fourth anode and a fourth cathode, said fourth anode being connected to said reference voltage line and said fourth cathode being connected to said second voltage line.

8. A charge coupled device according to claim 3, wherein said protection circuit comprises:

a voltage line;

a first MOS transistor connected between said signal input line and said voltage line, a channel thereof being connected to said voltage line and a gate thereof being connected to both said signal input line through a first capacitor and said voltage line through a first resistor, and a second MOS transistor connected between said reference voltage line and said voltage line, a channel thereof being connected to said voltage line and a gate thereof being connected to both said reference voltage line through a second capacitor and said voltage line through a second resistor.

9. A semiconductor apparatus comprising:

a semiconductor body;

an insulating film covering a major surface of said semiconductor body;

first and second gate electrodes formed on said insulating film such that said first gate electrode insulatingly overlaps said second gate electrode, one of said first and second gate electrodes being connected to a signal input line inputting a voltage signal thereto and the other being connected to a reference voltage line and said first gate electrode and said second gate electrode constituting a circuit section; and a protection circuit connected between said signal input line and said reference voltage line.

* * * * *